(12) United States Patent
Iyigun et al.

(10) Patent No.: US 10,489,244 B2
(45) Date of Patent: Nov. 26, 2019

(54) SYSTEMS AND METHODS FOR DETECTING AND CORRECTING MEMORY CORRUPTIONS IN SOFTWARE

(71) Applicant: Microsoft Technology Licensing, LLC, Redmond, WA (US)

(72) Inventors: Mehmet Iyigun, Kirkland, WA (US); Yevgeniy Bak, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 122 days.

(21) Appl. No.: 15/723,888

(22) Filed: Oct. 3, 2017

(65) Prior Publication Data

US 2019/0102251 A1   Apr. 4, 2019

(51) Int. Cl.
| | | |
|---|---|---|
| *G06F 11/00* | (2006.01) | |
| *G06F 11/10* | (2006.01) | |
| *G11C 29/52* | (2006.01) | |

(52) U.S. Cl.
CPC ........ *G06F 11/1068* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 2014/0040698 A1* | 2/2014 | Loh | G06F 13/1668 714/758 |
| 2014/0164825 A1* | 6/2014 | Grcanac | G06F 11/1092 714/6.24 |
| 2014/0282889 A1* | 9/2014 | Ishaya | H04L 63/08 726/4 |
| 2016/0283127 A1* | 9/2016 | Stabrawa | G06F 12/10 |
| 2017/0075762 A1* | 3/2017 | Hendrickson | G06F 3/0619 |
| 2017/0147219 A1* | 5/2017 | Leggette | G06F 16/1827 |

* cited by examiner

*Primary Examiner* — Daniel F. McMahon
(74) *Attorney, Agent, or Firm* — Arent Fox LLP (57) ABSTRACT

Examples described herein generally relate to a computer device including a memory and at least one processor configured to execute a process and manage the memory for the process. The processor is configured to receive a registration from the process for notifications regarding errors in the memory. The processor is configured to create first metadata regarding content of a portion of the memory allocated to the process when a physical memory address associated with a virtual address for the portion of memory is made non-writable to the process. The processor is configured to detect an error in the memory by comparing second metadata for current contents of the portion of memory to the first metadata. The processor is configured to provide a notification to the process in response to detecting the error. In some implementations, the processor is configured to determine whether the error is correctable based on the metadata.

20 Claims, 5 Drawing Sheets

SYSTEMS AND METHODS FOR DETECTING AND CORRECTING MEMORY CORRUPTIONS IN SOFTWARE

BACKGROUND

The present disclosure relates to memory management, and more particularly to error detection and correction in memory.

Generally, a computing device includes a random access memory (RAM) that stores instructions and data for various processes executed by a processor of the computing device. It is possible for content of RAM to become corrupted such that the content of the RAM no longer matches the originally stored value. For example, one or more bits of the RAM may change values. Example causes of corruption include faulty RAM hardware, erroneous operation of hardware or drivers, and cosmic radiation.

Corruption of RAM may lead to catastrophic failures of a computing device such as a system crash and corruption of the operating system or user data. Because RAM may include instructions or pointers to other instructions, a change in a single bit may result in an incorrect instruction being executed. The execution of the incorrect instruction may produce further errors, potentially leading to the catastrophic failure.

One attempt to mitigate RAM corruption is error correcting code (ECC) RAM. ECC RAM is hardware memory that not only stores data, but also stores redundant information and logic for automatically correcting errors in the data. Although ECC RAM is useful for mitigating RAM corruption, the specialized hardware is more expensive than typical RAM and is not often used in consumer grade computer devices.

Thus, there is a need in the art for improvements in memory management for computer devices.

SUMMARY

The following presents a simplified summary of one or more implementations of the present disclosure in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations of the present disclosure in a simplified form as a prelude to the more detailed description that is presented later.

The disclosure provides a computer device including a memory and at least one processor configured to execute a process and manage the memory for the process. The processor is configured to receive a registration from the process for notifications regarding errors in the memory. The processor is configured to create first metadata regarding content of a portion of the memory allocated to the process when a physical memory address associated with a virtual address for the portion of memory is made non-writable to the process. The processor is configured to detect an error in the memory by comparing second metadata for current contents of the portion of memory to the first metadata. The processor is configured to provide a notification to the process in response to detecting the error.

The disclosure provides a method of managing memory for a process executing on a processor. The method includes creating first metadata regarding content of a portion of memory allocated to the process when a physical memory address associated with a virtual address for the memory is made non-writable to the process. The method includes detecting an error in the memory by comparing second metadata for current contents of the portion of memory to the first metadata. The method includes determining whether the error is correctable by deterministically modifying one or more bits in the current contents of the portion of memory and evaluating metadata for the modified contents against the first metadata. The method includes providing a notification to the process at least when the error is not correctable.

Additional advantages and novel features relating to implementations of the present disclosure will be set forth in part in the description that follows, and in part will become more apparent to those skilled in the art upon examination of the following or upon learning by practice thereof.

DETAILED DESCRIPTION

The present disclosure provides systems and methods for detecting and correcting errors in memory using a computing device executing specialized software. In an implementation, a memory controller of an operating system generates metadata for a portion of the RAM when a physical memory address associated with a virtual address for the memory is made non-writable to the process. The metadata may be stored in association with the memory contents. The metadata may be information, such as a checksum, that allows a determination of whether the portion of the RAM is correct. Further, for example, the metadata may be a hash or a cyclic redundancy checksum. The current contents of the memory may be verified by generating a set of current metadata using the same generation technique and comparing the current metadata to the stored metadata. For example, the current contents of the memory may be verified periodically, or upon certain events such as a memory access or page fault.

In an implementation, the memory manager may also provide for recovery of corrupted memory contents. Many memory corruptions may be the result of a single bit flip, in which the value of one bit changes. When the memory manager determines that a portion of memory is corrupted due to the verification of metadata failing, the memory manager may attempt to recover the corrupted memory. The memory manager may iteratively change the value of a single bit in a set of bits in the corrupted portion of the memory and then regenerate the current metadata and attempt to verify the regenerated metadata against the stored metadata. Generally, this process may be relatively computation intensive, but may be a good tradeoff versus a system crash for relatively rare memory corruptions. Corrupted memory recovery may also be possible with larger bit errors, but the computational load grows exponentially with the number of errors. In an implementation, a configurable level of recovery may be defined for a specific process or based on system performance.

Figure 1:
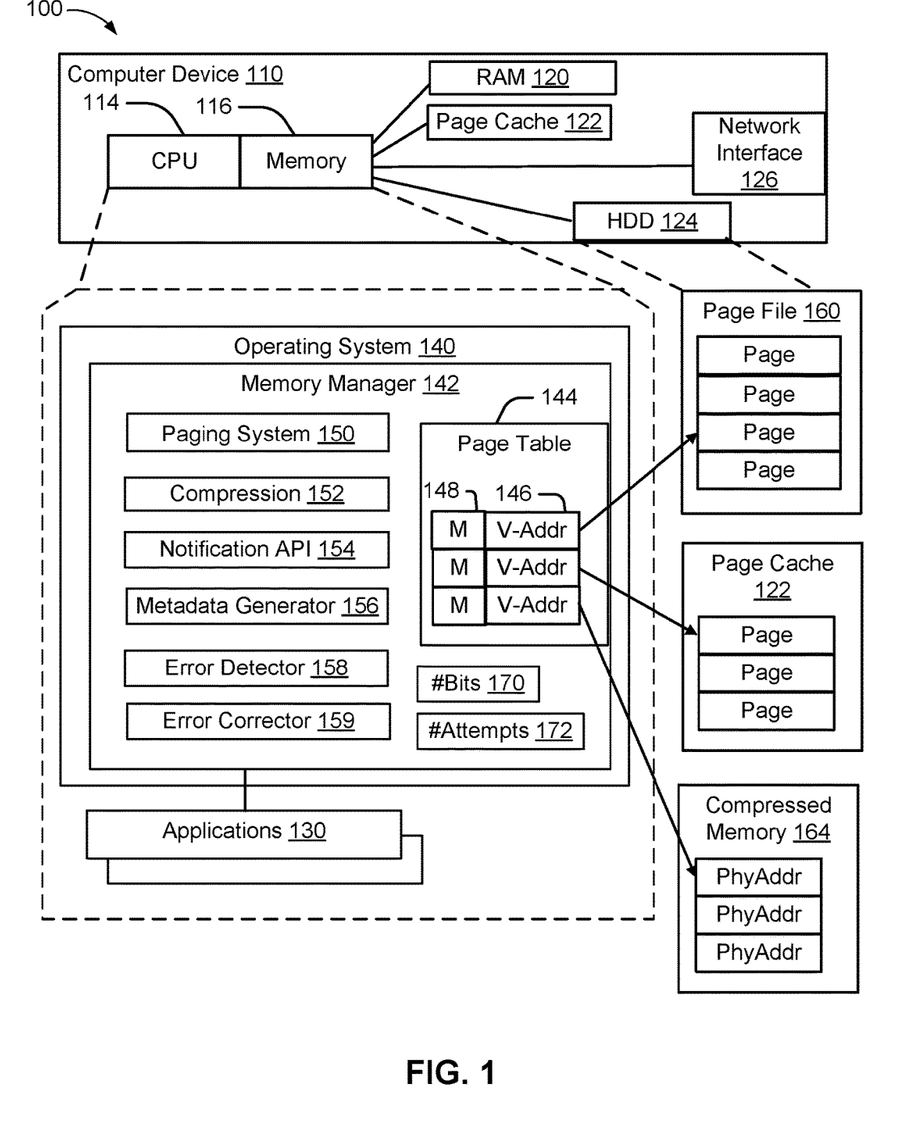
FIG. 1 is a diagram of an example computer system for detecting errors in a portion of memory allocated to a process in accordance with an implementation of the present disclosure.

Referring now to FIG. 1, an example computer system 100 includes a computer device 110. The computer device 110 may be, for example, any mobile or fixed computer device including but not limited to a desktop or laptop or tablet computer, a cellular telephone, a gaming device, a mixed reality or virtual reality device, a music device, a television, a navigation system, a camera, a personal digital assistant (PDA), a handheld device, any other computer device having wired and/or wireless connection capability with one or more other devices, or any other type of computerized device capable of generating a video-out signal.

The computer device 110 may include a CPU 114 that executes instructions stored in memory 116. For example, the CPU 114 may execute an operating system 140 and one or more applications 130. The operating system 140 and the applications 130 may each be associated with one or more processes that may be assigned a process identifier and allocated a portion of memory 116.

Memory 116 may be configured for storing data and/or computer-executable instructions defining and/or associated with an operating system 140 and/or application 130, and CPU 114 may execute operating system 140 and/or application 130. Memory 116 may represent one or more hardware memory devices accessible to computer device 110. An example of memory 116 can include, but is not limited to, a type of memory usable by a computer, such as random access memory (RAM), read only memory (ROM), tapes, magnetic discs, optical discs, volatile memory, non-volatile memory, and any combination thereof. Memory 116 may store local versions of applications being executed by CPU 114. In the illustrated example, memory 116 includes RAM 120, a page cache 122, a hard drive 124, and a network interface 126. The RAM 120 may be a hardware component such as one or more dual in-line memory modules (DIMM). The page cache 122 may be a portion of the RAM 120 used to store pages originating in secondary storage such as the hard drive 124. The hard drive 124 may represent any secondary storage. The hard drive 124 may have larger capacity but slower access time than the RAM 120. The hard drive 124 may store a page file 160 that includes pages that may be swapped into RAM 120 or page cache 122. The network interface 126 may also be used as a secondary storage, for example, as a network drive.

The CPU 114 may include one or more processors for executing instructions. An example of CPU 114 can include, but is not limited to, any processor specially programmed as described herein, including a controller, microcontroller, application specific integrated circuit (ASIC), field programmable gate array (FPGA), system on chip (SoC), or other programmable logic or state machine. The CPU 114 may include other processing components such as an arithmetic logic unit (ALU), registers, and a control unit. The CPU 114 may include multiple cores and may be able to process different sets of instructions and/or data concurrently using the multiple cores to execute multiple threads.

The operating system 140 may include instructions (such as applications 130) stored in memory 116 and executable by the CPU 114. The operating system 140 may include a memory manager 142 for allocating memory to processes. For example, the memory manager 142 may implement a virtual memory system. The memory 116 may include a limited amount of RAM 120. The processes executed by the CPU 114 may request more memory than the available amount of RAM 120. A large portion of the requested memory, however, may remain idle for substantial amounts of time. The memory manager 142 may use virtual memory to satisfy requests for memory by allocating virtual memory addresses 146 to processes. The virtual memory addresses 146 may then be associated with respective physical memory addresses in the RAM 120 or pages, which may be stored in other logical and physical components such as a page file 160, page cache 122, compressed memory 164, or hard drive 124. In an implementation, the virtual memory may include a page table 144 that stores the location of the memory contents (e.g., a pointer) for each virtual memory address 146. In an implementation, the page table 144 may also store metadata 148 for detecting and correcting memory errors or corruption. For example a set of metadata 148 may be associated with each virtual memory address 146 in page table 144. Further details of an example virtual memory system are described in further detail below regarding FIG. 2.

A paging system 150 may manage virtual memory addresses. A page may be a fixed-length continuous block of memory. The operating system 140 may be configured with the fixed-length page size. The paging system 150 may move the page associated with a virtual memory address between the logical and physical storage devices as needed to manage the memory 116. For example, the paging system 150 may determine whether a process is likely to access a page, and move the page to a location appropriate for the predicted likelihood of access. For example, active pages may be kept in the RAM, which may have a relatively fast access speed, while inactive pages may be moved to the page file 160, which may have a relatively slow access speed.

A compression component 152 may transfer pages into compressed memory 164 rather than the page file 160. The compressed memory 164 may be a portion of the RAM where pages are compressed. Accordingly, a process may not be able to write to a page in compressed memory 164, but may be able to relatively quickly access the page for reading. The page may also be transferred quickly into the regular RAM 120 by decompressing the page. Accordingly, compressed memory may effectively increase the size of virtual memory with less delay than using a page file.

A notification application programming interface (API) 154 may allow a process to communicate with the memory manager 142 to configure some features of memory management for the process. In an implementation, the memory manager 142 may provide notifications regarding corrupted memory to a process. For example, the memory manager 142 may generate a notification when corrupted memory is detected. For instance, the memory manager 142 may throw an exception indicating that corrupted memory has been detected (e.g., the metadata validation has failed). The process may indicate whether the process is handling the exception. If the memory manager 142 does not receive an indication that the process is handling the exception, the memory manager 142 may determine how to handle the exception (e.g., attempt recovery, terminate process, crash system). As another example of a notification, the memory manager 142 may generate a notification when corrupted data is corrected. Similar to the detection of corrupted memory, some processes may handle corrected memory in a particular manner. For example, the process may be able to regenerate the data rather than trust that the memory manager 142 has successfully corrected the corrupted memory. In other cases, a process may choose not to receive notification when corrupted memory is corrected.

Metadata generator 156 may generate metadata 148 for a portion of memory. For example, the metadata generator 156 may generate metadata 148 for a page. The metadata 148 may be a checksum that can be used to probabilistically determine whether current memory contents are the same as previous memory contents. For example, the metadata 148 may be a hash or cyclic redundancy check (CRC) of the page. The size of the metadata 148 may be a number of bits 170 and may be configurable but is substantially smaller than the page size. For example, the metadata may have a length such that any single bit flip in the page should result in a different metadata value. For example, a 4 kB page may be associated with at least 15 bits of metadata to represent $32k$ unique values. In an implementation, a larger amount of metadata, 32 bits per 4 kB page, for example may be used. A larger amount of metadata 148 may increase the likelihood that an error is detectable and correctable with a tradeoff of increased storage costs. In an implementation, the metadata generator 156 may be or include a hardware accelerator for quickly generating the metadata (e.g., by implementing a hash algorithm in hardware).

The error detector 158 may evaluate whether a page has become corrupted. For example, the error detector 158 may use the metadata generator 156 to generate current metadata for the current page and compare the current metadata to the stored metadata. If the current metadata matches the stored metadata, the probability that the current page has become corrupted is low. However, with a sufficient number of metadata bits, if the current metadata does not match the stored metadata, the probability that the current page has become corrupt is nearly certain. The error detector 158 may provide an indication to the notification API 154 when an error is detected. The error detector 158 may be configured to evaluate a page when access to the page is requested by a process. Accordingly, the error detector 158 may ensure that processes are receiving validated data. Additionally or alternatively, the error detector 158 may periodically evaluate pages to determine whether the page has become corrupted. For example, the error detector 158 may use idle processes to check for errors or may select pages that have been in memory for relatively long times.

The error corrector 159 may attempt to correct a corrupted page when detected by the error detector 158. The error corrector 159 may deterministically modify bits of the current page to generate a modified page. For example, the error corrector 159 may sequentially modify each bit individually to test each possible single bit error. The error corrector 159 may then use the error detector 158 to evaluate whether the modified page matches the original page (i.e., metadata based on the modified page matches the stored metadata). Error correction in this manner may be computationally intensive due to the number of possible modified pages. The number of possible modified pages grows exponentially with the number of errors to be corrected. Further, the ability to correct an error depends on the size of the metadata 148, which may be a number of bits 170. The error corrector 159 may be configured with a number of attempts 172 that defines how many attempts the error corrector should attempt. The number of attempts 172 may be dynamically configured for specific processes. For example, a low priority process may register using the notification API 154 for no attempts at error correction, whereas a critical process may register for a maximum number of attempts (e.g., based on a page size, number of metadata bits, and a number of errors that can feasibly be corrected). In an implementation, the notification API 154 may communicate with the process to determine a priority of the process or a priority of the specific memory location to determine the number of attempts.

Figure 2:
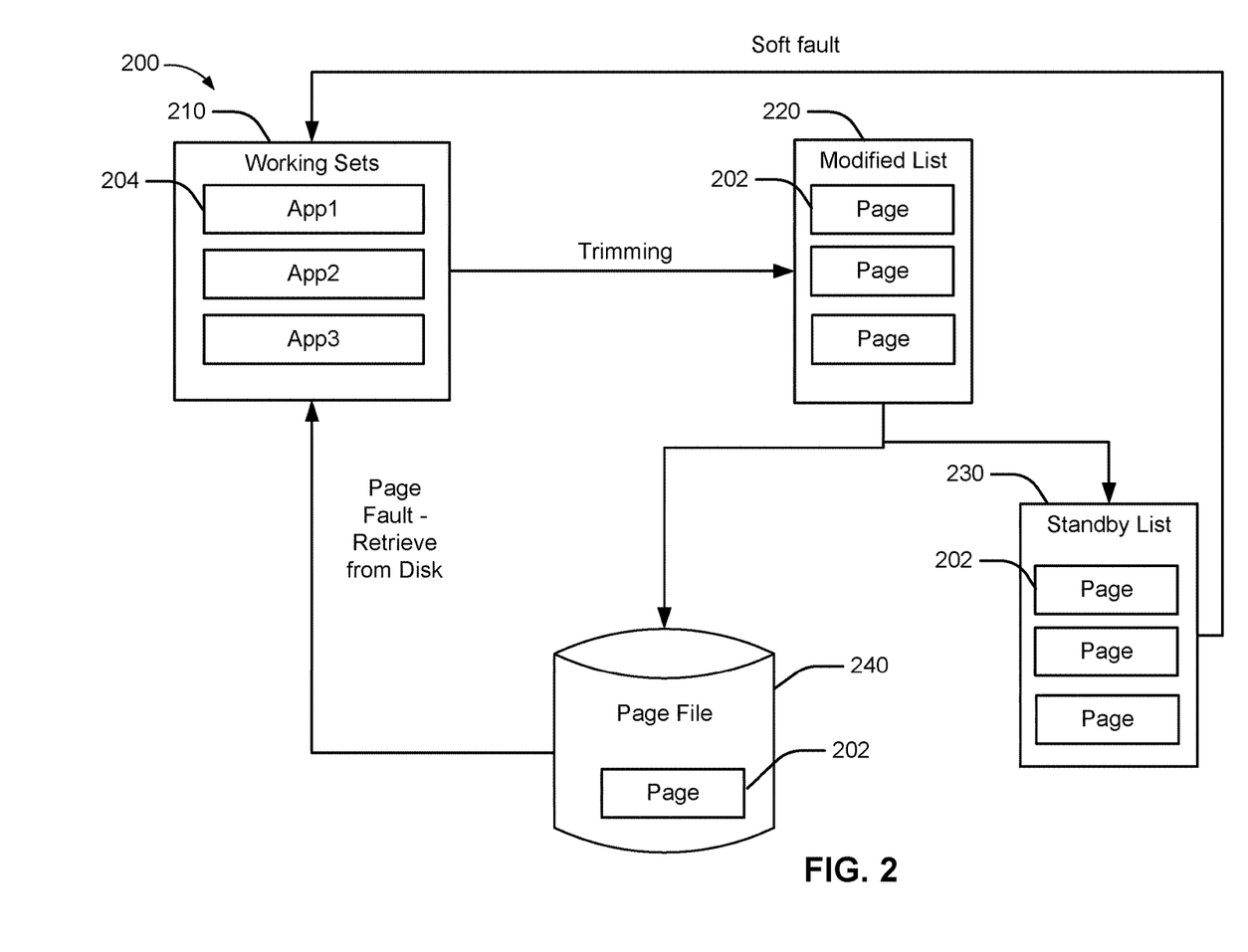
FIG. 2 is a diagram of an example virtual memory system for managing a page of memory in accordance with an implementation of the present disclosure.

Referring now to FIG. 2, the conceptual diagram 200 shows an example implementation of paging system 150. The paging system 150 may organize pages 202 into working sets 210, a modified list 220, a standby list 230, and a page file 240. The working sets 210 may include active memory associated with one or more applications or processes. The working sets 210 may include page frames 204. The working sets 210 may be stored in RAM 120 and a physical address of the working sets 210 may be writable by at least one process. In an implementation, the memory manager 142 may not attempt to generate metadata based on the working sets 210 because the content is likely to change. The process of removing a page frame 204 from the working set 210 to create a page 202 may be referred to as trimming. The paging system 150 may trim pages 202 that are less likely to be accessed (e.g., pages that have not been accessed recently). When a page 202 is trimmed from the working sets 210, the physical address of the page 202 in RAM 120 may be made non-writable to the process. The metadata generator 156 may generate metadata as pages 202 are trimmed from the working sets 210. The modified list 220 includes pages 202 that have not been stored in the page file 240. For example, the modified list may include new pages 202 with no corresponding page 202 in the page file 240, or modified pages 202 that were previously stored in the page file 240 but have been retrieved and modified. Pages 202 in the modified list 220 may be written to the page file 240. The standby list 230 may include pages that have been stored in the page file 240, but are also still available in RAM. The pages 202 in the standby list 230 may be retrieved upon request, but may also be deleted or overwritten as necessary.

Figure 3:
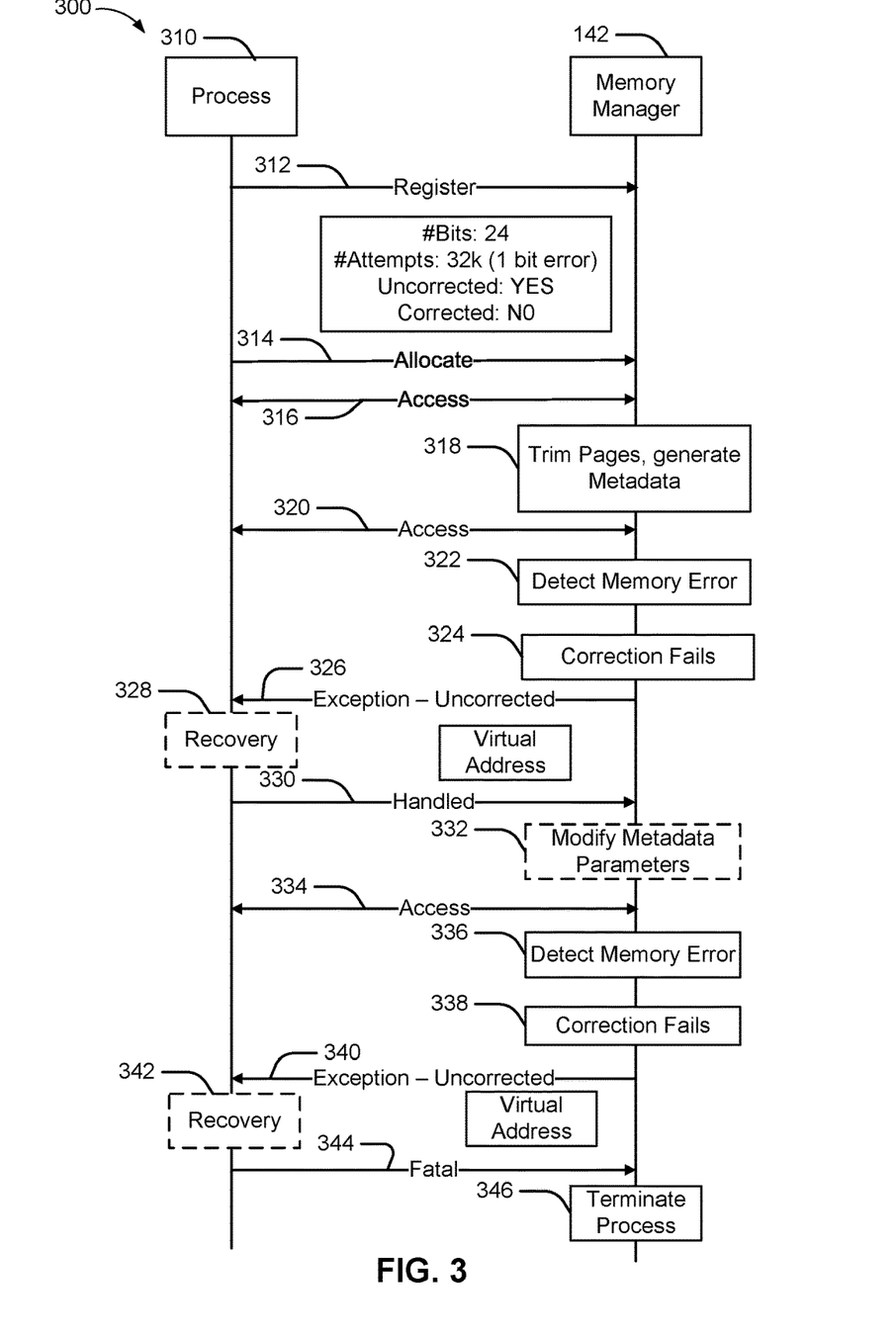
FIG. 3 is a message diagram of communications regarding memory errors in accordance with an implementation of the present disclosure.

Referring now to FIG. 3, a message diagram 300 illustrates example communications between a process 310 and the memory manager 142 via a notification API. The process 310 may correspond to an application 130 or may be a process of operating system 140.

At 312, the process 310 may register with the memory manager 142 to receive notifications regarding memory errors. For example, the process 310 may call a register function included in the notification API 154. The register function may take several parameters such as, for example, a number of bits of metadata, a number of attempts, and types of notifications to receive. For instance, as illustrated, the process 310 may register to receive notifications and request 24 bits of metadata to be stored for every page, request error correction for single-bit errors, which may require 32 k attempts to check each bit in a 4 kB page. The process 310 may also request notification of uncorrected errors but no notification of corrected errors. It should be appreciated that a registration function may accept various parameters, which may be represented by various data elements as defined by the API.

At 314, the process 314 may request an allocation of memory. For example, the requested allocation of memory may be used to store instructions, temporary variables, or user data. The memory manager 142 may allocate the memory and fulfill the request using virtual memory in a manner transparent to the process 310.

At 316, the process 310 may access the allocated memory. For example, the process 310 may read from or write to the memory. The memory manager 142 may provide the access in a transparent manner. For example, at 318, the memory manager 142 may trim pages and generate metadata. As discussed above, the memory manager 142 may compress pages, swap pages to the page file, or page cache, or otherwise remove the page from the RAM 120. The memory manager 142 may generate the metadata 148 according to the parameters of the registration 312 or using default parameters or dynamic parameters selected by the memory manager 142. At 320, the process 310 may continue to access the allocated memory. If no errors are detected, the memory manager 142 may continue to operate in a transparent manner.

At 322, the memory manager 142 may detect a memory error. For example, in response to an access request 320, the memory manager 142 may attempt to validate a page using metadata 148 and determine that the stored metadata 148 does not match the current content of the requested memory. Accordingly, the memory manager 142 may determine that a memory error has occurred and that the requested memory address is corrupted.

At 324, the memory manager 142 may attempt to correct the detected memory error. For example, based on the registration to correct single-bit errors, the error corrector 159 may modify a single bit in the content of the requested memory and attempt to validate the modified content. The error corrector 159 may test each bit until a valid modified content is found or the number of attempts 172 is reached. In the illustrated example, the error corrector 159 may determine that the error is uncorrectable.

At 326, the memory manager 142 may throw an exception indicating that an uncorrected memory error has occurred. That is, the memory manager 142 may send a notification of the memory error to the process 310 based on the registration 312. The notification may include the virtual address where the memory error occurred.

At 328, the process 310 may optionally perform recovery of the memory error. Whether recovery is possible may depend on the specifics of the process 310 and the use of the memory. For example, the process 310 may have no instructions for recovering a memory error, and may instead attempt to mitigate damage (e.g., by terminating). As another example, the process 310 may determine that the virtual address corresponds to temporary data or user data. The process 310 may be able to recover temporary data, for example, by re-executing the code that generated the temporary data. The process 310 may be able to recover user data by receiving input from a user. Alternatively, the user data may be able to tolerate some level of corruption (e.g., a single bit in an image file may not be noticeable). As another example, if the virtual address points to executable instructions, the process 310 may be unable to recover the memory error.

At 330, the process 310 may indicate that the memory error has been handled by the process 310. That is, the process 310 may indicate that the recovery 328 was successful. The process 310 may indicate how the memory manager 142 should handle the virtual address. For example, the process 310 may indicate that the corrupted memory contents should remain, that the corrupted memory should be freed, or that the corrupted memory contents should be replaced. The memory manager 142 may control the memory as indicated by the process 310. The memory manager 142 may then continue under the assumption that the memory contents are correct and no further action is need to handle the memory error.

At 332, the memory manager 142 may modify metadata parameters. The detection of a memory error may be symptomatic of a hardware problem. For example, a RAM DIMM may be faulty, or exposed to high temperatures or radiation. The memory manager 142 may attempt to provide increased protection against future memory errors. The memory manager 142 may record each memory error and determine whether a pattern of errors justifies increased protection. An example of increased protection may include increasing the amount of metadata stored for a page. The increased amount of metadata may increase the likelihood that errors are detected and correctable. As another example, the memory manager may increase the number of attempts to correct corrupted memory. In an implementation, the increase protection may be associated with the process 310, all memory controlled by the memory manager 142, or specific hardware. For example, the memory manager 142 may identify a RAM DIMM or portion thereof associated with memory errors and increase protection for that portion of RAM 120. In an implementation, the memory manager 142 may quarantine (e.g., prohibit access to) a portion of RAM 120 associated with memory errors.

At 334, the process 310 may continue to access the memory via the memory manager 142. At 336, the memory manager 142 may detect another memory error, e.g., the error detector 158 may determine that metadata for the current memory contents does not match stored metadata 148. At 338, the memory manager 142 may attempt to correct the memory error in the same manner as at 324. Once again, the memory manager 142 may be unable to correct the error, and at 340, the memory manager 142 may throw an exception for an uncorrected error.

At 342, the process 310 may attempt to recover the error. In the illustrated example, the process 310 may be unable to recover the error. At 344, the process 310 may indicate that the error is fatal. The process 310 may terminate itself, possibly generating an error message for a user. At 346, the memory manager 142 may determine that the error was fatal based on the indication 344 or lack of any response from the process 310. The memory manager 142 may terminate the process 310 or take another action to prevent further corruption. For example, the memory manager 142 may cause a system failure to prevent further corruption if the process 310 has executed corrupted code.

Figure 4:
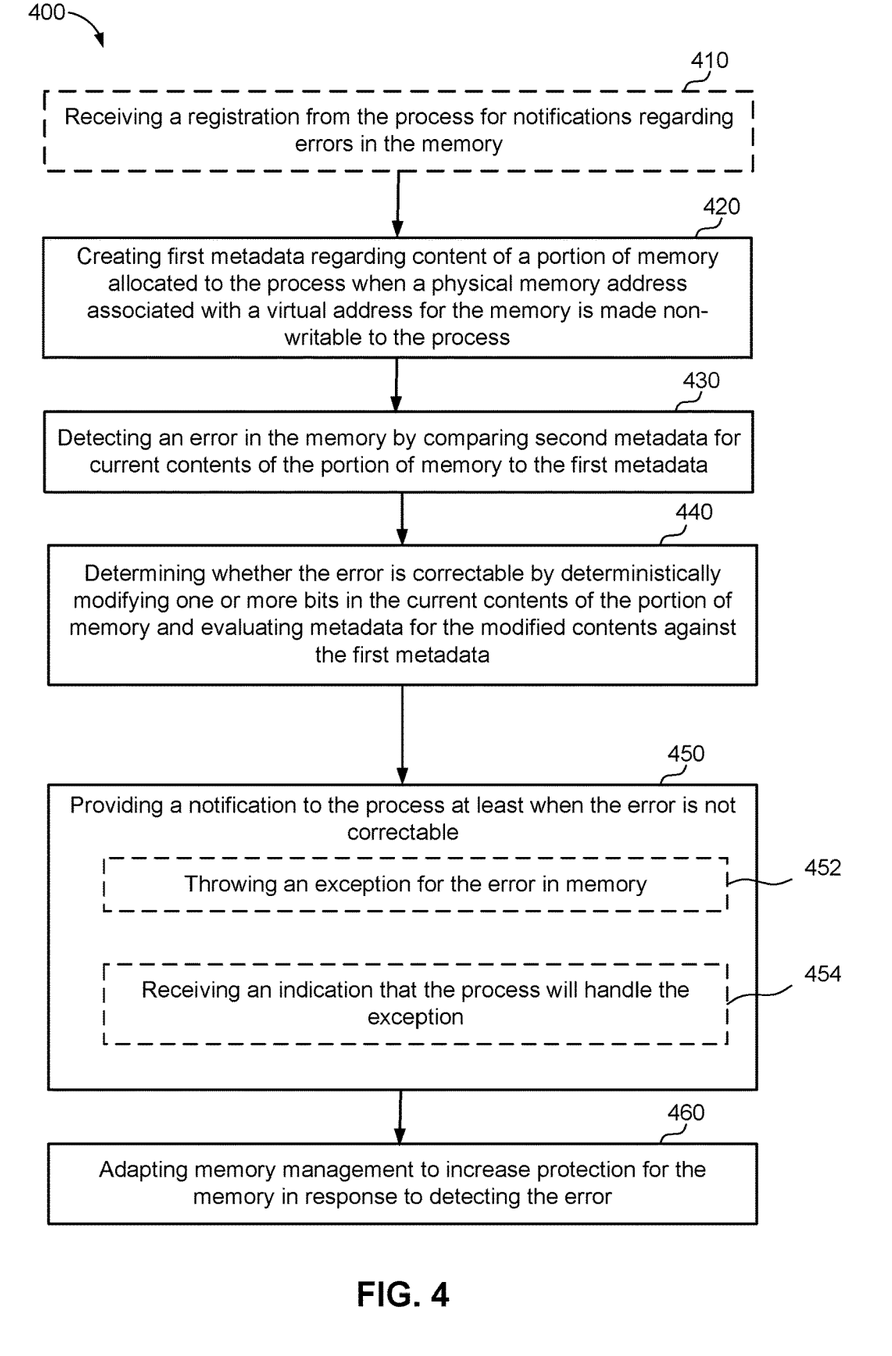
FIG. 4 is a flowchart of an example method of managing memory for a process in accordance with an implementation of the present disclosure.

Referring now to FIG. 4, an example method 400 provides for notifications of errors in memory allocated to a process. For example, method 400 may be performed by the memory manager 142 of the operating system 140 on the computer device 110.

At 410, the method 400 may optionally include receiving a registration from the process for notifications regarding errors in the memory. For instance, memory manager 142 may receive a registration or notifications regarding errors in the memory 116 from the process 310 via the notification API 154. The registration may occur before, during, or after the process 310 requests the memory manager 142 to allocate memory to the process 310. The registration may define when the process should receive notifications regarding memory errors. For example, the registration may include parameters defining an amount of metadata to create for detecting errors and a number of attempts to correct errors before sending a notification. The registration may also identify one or more types of errors that should be reported to the process 310. For example, types of errors may include corrected errors and uncorrected errors. In an implementation, the memory manager 142 may register a process with a default level of error detection, correction, or notification if no registration is received. For example, the memory manager 142 may perform error correction for a process regardless of registration.

At 420, the method 400 may include creating first metadata regarding content of a portion of memory allocated to the process when a physical memory address associated with a virtual address for the memory is made non-writable to the process. For instance, in an implementation, the memory manager 142 may execute the metadata generator 156 to create first metadata 148 regarding content of a portion of memory 116 allocated to the process 310 when a physical memory address (e.g., for RAM 120) is made non-writable to the process 310. The portion of memory may be a page. The metadata generator 156 may store the metadata 148 in a page table in association with the virtual address.

There are several scenarios where the portion of memory may be made non-writable to the process. In a first scenario, the portion of memory may be made non-writable when a last virtual address page table entry removes a write permission. The page table 144 may maintain one or more entries for a page defining which processes may write to a page. When write permission is removed from each page table entry for a virtual memory address, the metadata generator 156 may generate metadata for the virtual memory address and store the metadata 148 in the page table 144. In a second scenario, the portion of memory may be made non-writable when the memory allocated to the process is compressed. The metadata generator 156 may generate metadata 148 for either the uncompressed content or the compressed content. In a third scenario, the portion of memory may be made non-writable when the memory allocated to the process is written to a page cache or page file. For example, a page may be written to the page cache 122, then to the page file 160. In an implementation, trimming a virtual address from the working sets 210 may include making the virtual address non-writable.

At 430, the method 400 may include detecting an error in the memory by comparing second metadata for current contents of the portion of memory to the first metadata. In an implementation, for example, the memory manager 142 may execute the error detector 158 to compare second metadata for current contents of the portion of memory 116 to the first metadata 148. The error detector 158 may execute the metadata generator 156 to generate the second metadata for the current contents of the portion of memory. For instance, the memory manager 142 may execute error detector 158 whenever a page fault occurs and the content is retrieved from secondary memory. Performing error detection on access, however, may increase latency of the memory access. In another example, the memory manager 142 may periodically execute the error detector 158 or may execute error detector on contents that have been in memory for a threshold period of time.

At 440, the method 400 may include determining whether the error is correctable by deterministically modifying one or more bits in the current contents of the memory and evaluating metadata for the modified contents against the first metadata. For instance, the memory manager 142 may execute the error corrector 159 to determine whether the error is correctable by deterministically modifying one or more bits in the current contents of the portion of memory and evaluating metadata for the modified contents against the first metadata 148. For example, the error corrector 159 may systematically flip each individual bit in the current contents to test for single bit errors, then flip pairs of bits to check for two bit errors, and so on. The error corrector may be configured for a limited number of attempts and determine that the error is not correctable when the limit is reached. For example, the limited number of attempts may be configured based on the registration. Alternatively, the error corrector 159 may perform a default number of attempts (e.g., corresponding to single bit errors) if no registration is received. The error corrector 159 may execute the error detector 158 to evaluate the metadata for each set of modified contents. Once again, the error detector 158 may execute the metadata generator 156 to generate the metadata for evaluation.

At 450, the method 400 may include providing a notification to the process at least when the error is not correctable. For example, the memory manager 142 may execute the notification API 154 to provide the notification to the process 310 at least when the error is not correctable. The memory manager 142 may provide a notification when the error is not correctable regardless of a registration. In an implementation, the notification may be based on the registration in action 410. For example, if the process 310 registers to receive notifications for corrected memory errors, the memory manager 142 may provide notifications for both corrected and uncorrectable errors. In an alternative implementation, the memory manager 142 may provide notifications only if the process registers for such notifications. In the case where a process does not register to receive any notifications, the memory manager 142 may terminate the application or shut down the system to prevent the memory error from corrupting other memory.

In an implementation, the notification may be in the form of an exception. For example, at 452, the memory manager 142 may throw an exception for the error in memory. Depending on the nature of the error and the characteristics of the process 310, the process 310 may be able to handle the error. That is, the process 310 may be able to confirm that the process 310 can safely continue despite the memory error. At 454, the memory manager 142 may receive an indication that the process will handle the exception.

At 460, the method 400 may include adapting memory management to increase protection for the memory in response to detecting the error. For example, the memory manager 142 may adapt one or more parameters to increase protection for the memory 116 in response to detecting the error. For example, the memory manager 142 may dynamically adjust a ratio of metadata to the portion of memory in response to detecting the error. For instance, the memory manager 142 may increase the #bits 170 (e.g., by changing a hashing algorithm) while keeping a fixed page size. As another example, the memory manager 142 may dynamically adjusting a number of attempts to correct the error. For instance, the memory manager 142 may increase the number of attempts 172, for example, to attempt correction of two bit errors in addition to single bit errors. As another example, the memory manager 142 may quarantine a physical memory location associated with the error. For instance, the memory manager 142 may stop allocating a physical address in RAM 120 associated with the error.

Figure 5:
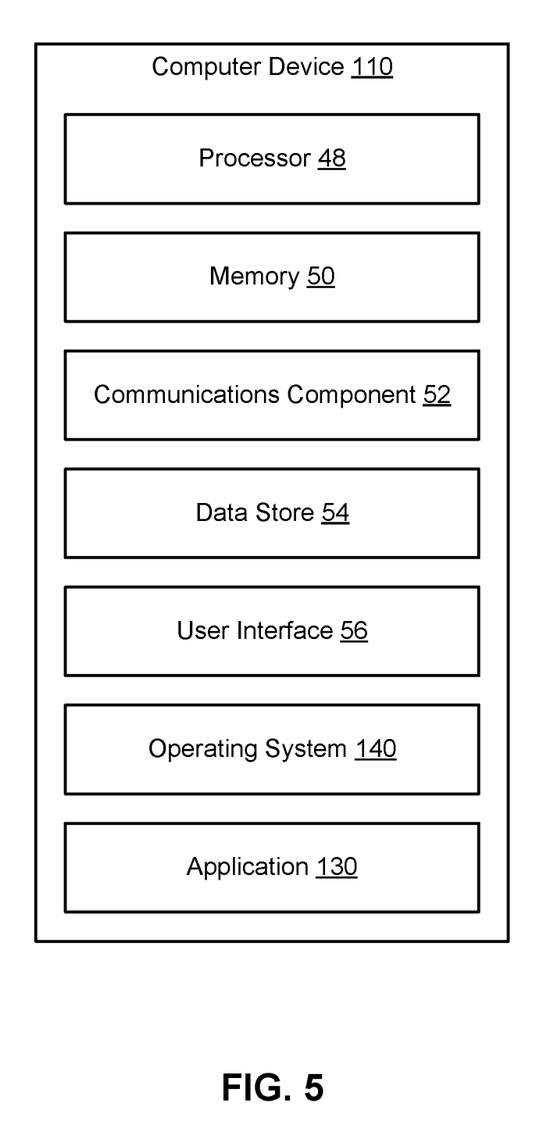
FIG. 5 is a schematic block diagram of an example computer device in accordance with an implementation of the present disclosure.

Referring now to FIG. 5, illustrated is an example computer device 110 in accordance with an implementation, including additional component details as compared to FIG. 1. In one example, computer device 110 may include processor 48 for carrying out processing functions associated with one or more of components and functions described herein. Processor 48 can include a single or multiple set of processors or multi-core processors. Moreover, processor 48 can be implemented as an integrated processing system and/or a distributed processing system. In an implementation, for example, processor 48 may include CPU 114.

In an example, computer device 110 may include memory 50 for storing instructions executable by the processor 48 for carrying out the functions described herein. In an implementation, for example, memory 50 may include memory 116.

Further, computer device 110 may include a communications component 52 that provides for establishing and maintaining communications with one or more parties utilizing hardware, software, and services as described herein. Communications component 52 may carry communications between components on computer device 110, as well as between computer device 110 and external devices, such as devices located across a communications network and/or devices serially or locally connected to computer device 110. For example, communications component 52 may include one or more buses, and may further include transmit chain components and receive chain components associated with a transmitter and receiver, respectively, operable for interfacing with external devices.

Additionally, computer device 110 may include a data store 54, which can be any suitable combination of hardware and/or software, that provides for mass storage of information, databases, and programs employed in connection with implementations described herein. For example, data store 54 may be a data repository for operating system 140 and/or applications 130. The data store may include memory 116.

Computer device 110 may also include a user interface component 56 operable to receive inputs from a user of computer device 110 and further operable to generate outputs for presentation to the user. User interface component 56 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, user interface component 56 may include one or more output devices, including but not limited to a display, a speaker, a haptic feedback mechanism, a printer, any other mechanism capable of presenting an output to a user, or any combination thereof.

In an implementation, user interface component 56 may transmit and/or receive messages corresponding to the operation of operating system 140 and/or application 130. In addition, processor 48 may execute operating system 140 and/or application 130, and memory 50 or data store 54 may store them.

As used in this application, the terms "component," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computer device and the computer device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various implementations or features may have been presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

The various illustrative logics, logical blocks, and actions of methods described in connection with the embodiments disclosed herein may be implemented or performed with a specially-programmed one of a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computer devices, e.g., a combination of a DSP and a microprocessor, a plurality of microprocessors, one or more microprocessors in conjunction with a DSP core, or any other such configuration. Additionally, at least one processor may comprise one or more components operable to perform one or more of the steps and/or actions described above.

Further, the steps and/or actions of a method or procedure described in connection with the implementations disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some implementations, the processor and the storage medium may reside in an ASIC. Additionally, the ASIC may reside in a user terminal. In the alternative, the processor and the storage medium may reside as discrete components in a user terminal. Additionally, in some implementations, the steps and/or actions of a method or procedure may reside as one or any combination or set of codes and/or instructions on a machine readable medium and/or computer readable medium, which may be incorporated into a computer program product.

In one or more implementations, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs usually reproduce data optically with lasers. Combinations of the above should also be included within the scope of computer-readable media.

While implementations of the present disclosure have been described in connection with examples thereof, it will be understood by those skilled in the art that variations and modifications of the implementations described above may be made without departing from the scope hereof. Other implementations will be apparent to those skilled in the art from a consideration of the specification or from a practice in accordance with examples disclosed herein.

What is claimed is:

1. A computer device, comprising:
   a memory storing computer executable instructions; and
   at least one processor configured to execute a process and execute the computer executable instructions to manage the memory for the process, wherein the computer executable instructions, when executed by the at least one processor cause the processor to:
   receive, via an application programming interface of a memory manager, a registration from the process for notifications regarding errors in the memory;
   create first metadata regarding content of a portion of the memory allocated to process when a physical memory address associated with a virtual address for the portion of the memory is made non-writable to the process;
   detect an error in the memory by comparing second metadata for current contents of the portion of the memory to the first metadata; and
   provide a notification to the process in response to detecting the error.

2. The computer device of claim 1, wherein the at least one processor is configured to execute the computer executable instructions to provide the notification to the process by throwing an exception for the error in the memory.

3. The computer device of claim 2, wherein the at least one processor is configured to execute the computer executable instructions to receive an indication that the process will handle the exception.

4. The computer device of claim 3, wherein the at least one processor is configured to execute the computer executable instructions to terminate the process when the indication is not received.

5. The computer device of claim 1, wherein the at least one processor is configured to execute the computer executable instructions to determine whether the error is correctable by deterministically modifying one or more bits in the current contents of the portion of the memory to create modified contents and evaluating metadata for the modified contents against the first metadata.

6. The computer device of claim 1, wherein the at least one processor is configured to execute the computer executable instructions to dynamically adjust a ratio of metadata to the portion of the memory in response to detecting the error.

7. The computer device of claim 1, wherein the at least one processor is configured to execute the computer executable instructions to quarantine a physical memory location associated with the error.

8. The computer device of claim 1, wherein the at least one processor is configured to execute the computer executable instructions to dynamically adjust a number of attempts to correct the error.

9. The computer device of claim 1, wherein the at least one processor is configured to execute the computer executable instructions to create the first metadata when a last virtual address page table entry removes a write permission, when the portion of the memory allocated to the process is compressed, or when the portion of the memory allocated to the process is written to a page cache or page file.

10. The computer device of claim 1, wherein the at least one processor is configured to execute the computer executable instructions to shut down the computer device upon detecting the error when the registration indicates that the process cannot tolerate an error in the memory.

11. The computer device of claim 1, wherein detecting the error in the memory comprises periodically comparing the second metadata to the first metadata or comparing the second metadata to the first metadata in response to an access to the portion of the memory.

12. The computer device of claim 1, wherein the at least one processor is configured to execute the computer executable instructions to:
   create third metadata regarding content of a second portion of the memory, the second portion of the memory being allocated to a second process;
   detect an error in the memory by comparing fourth metadata for current contents of the second portion of the memory to the third metadata; and
   attempt to correct the error by modifying one or more bits in the current contents of the second portion of the memory to create modified contents and evaluating metadata, for the modified contents against the third metadata, regardless of a registration for the second process.

13. A method of managing a memory for a process executing on a processor, comprising:
   creating first metadata regarding content of a portion of memory allocated to the process when a physical memory address associated with a virtual address for the memory is made non-writable to the process;
   detecting an error in the memory by comparing second metadata for current contents of the portion of memory, to the first metadata;
   determining whether the error is correctable by deterministically modifying one or more bits in the current contents of the portion of memory to create modified contents and evaluating metadata for the modified contents against the first metadata; and
   providing a notification to the process, via an application programming interface of a memory manager, at least when the error is not correctable.

14. The method of claim 13, further comprising receiving a registration from the process for notifications regarding errors in the memory portion of memory allocated to the process.

15. The method of claim 14, wherein providing the notification to the process comprises throwing an exception.

16. The method of claim 15, further comprising receiving an indication that the process will handle the exception.

17. The method of claim 13, farther comprising, dynamically adjusting a ratio of metadata to the portion of memory in response to detecting the error.

18. The method of claim 13, farther comprising quarantining a physical memory location associated with the error.

19. The method of claim 13, further comprising dynamically adjusting a number of attempts to correct the error.

20. The method of claim 13, wherein creating the first metadata comprises creating the first metadata when a last virtual address page table entry removes a write permission, when the memory allocated to the process is compressed, or when the memory allocated to the process is written to a page cache or page file.

\* \* \* \* \*